United States Patent [19]
Graham et al.

[11] Patent Number: 5,177,667
[45] Date of Patent: Jan. 5, 1993

[54] THERMAL CONDUCTION MODULE WITH INTEGRAL IMPINGEMENT COOLING

[75] Inventors: Nadia H. Graham, New Paltz; Kevin P. Moran, Wappingers Falls, both of N.Y.

[73] Assignee: International Business Machines Corporation, Armonk, N.Y.

[21] Appl. No.: 783,631

[22] Filed: Oct. 25, 1991

[51] Int. Cl.⁵ .............................................. H05K 7/20
[52] U.S. Cl. .................................. 361/385; 361/386; 257/714
[58] Field of Search ................ 165/804, 185; 357/81, 357/82; 361/382, 385–386, 388; 174/16.3

[56] References Cited

U.S. PATENT DOCUMENTS

| | | | |
|---|---|---|---|
| 3,524,497 | 4/1968 | Chu et al. | 165/80 |
| 4,138,692 | 2/1979 | Meeker et al. | 357/82 |
| 4,494,171 | 1/1985 | Bland et al. | 361/386 |
| 4,574,877 | 2/1986 | Klein | 165/104.33 |
| 4,686,606 | 8/1987 | Yamada et al. | 361/385 |
| 4,758,926 | 7/1988 | Herrell et al. | 361/385 |
| 4,882,654 | 11/1989 | Nelson et al. | 361/382 |
| 4,920,574 | 4/1990 | Yamamoto et al. | 361/385 |
| 4,962,444 | 10/1990 | Niggemann | 361/382 |
| 4,964,458 | 10/1990 | Flint et al. | 165/80.4 |
| 4,977,443 | 12/1990 | Kobayashi et al. | 357/82 |
| 4,977,444 | 12/1990 | Nakajima et al. | 361/382 |
| 5,023,695 | 6/1991 | Umezawa et al. | 357/82 |
| 5,050,037 | 9/1991 | Yamamoto et al. | 361/386 |

FOREIGN PATENT DOCUMENTS

| | | |
|---|---|---|
| 0194216 | 2/1985 | European Pat. Off. |
| 56-150841 | 11/1981 | Japan |
| 57-96557 | 6/1982 | Japan |
| 57-103337 | 6/1982 | Japan |
| 1112445 | 3/1982 | U.S.S.R. |

OTHER PUBLICATIONS

Damm, Jr., IBM Tech Disclosure Bulletin, "Convection Cooling Apparatus", vol. 20, No. 7, Dec. 1977, pp. 2755–2756.

IBM Technical Disclosure Bulletin, vol. 20, No. 10 (Mar. 1978) pp. 3898–3899.

*Primary Examiner*—Gregory D. Thompson
*Attorney, Agent, or Firm*—Aziz M. Ahsan; Peter W. Peterson

[57] ABSTRACT

A thermal conduction module for cooling an array of integrated circuit chips mounted on a substrate includes a moveable piston for cooling the chips, the piston having a base, urged against an upper surface of the chips, of thermally conductive material. The base has on the lower surface thereof cups or channels between adjacent rows of the chips, and, on the upper surface thereof, parallel channels directly over the chips. The piston includes members extending downward into the upper surface channels for directing a flow of coolant into the upper surface channels and impinging the coolant on the channel bottoms. The flow directing members may be plate-like baffles or nozzles. The piston also includes passages for directing coolant from one upper surface channel to an adjacent upper surface channel in a flow direction perpendicular to the axes of the upper surface channels.

29 Claims, 4 Drawing Sheets

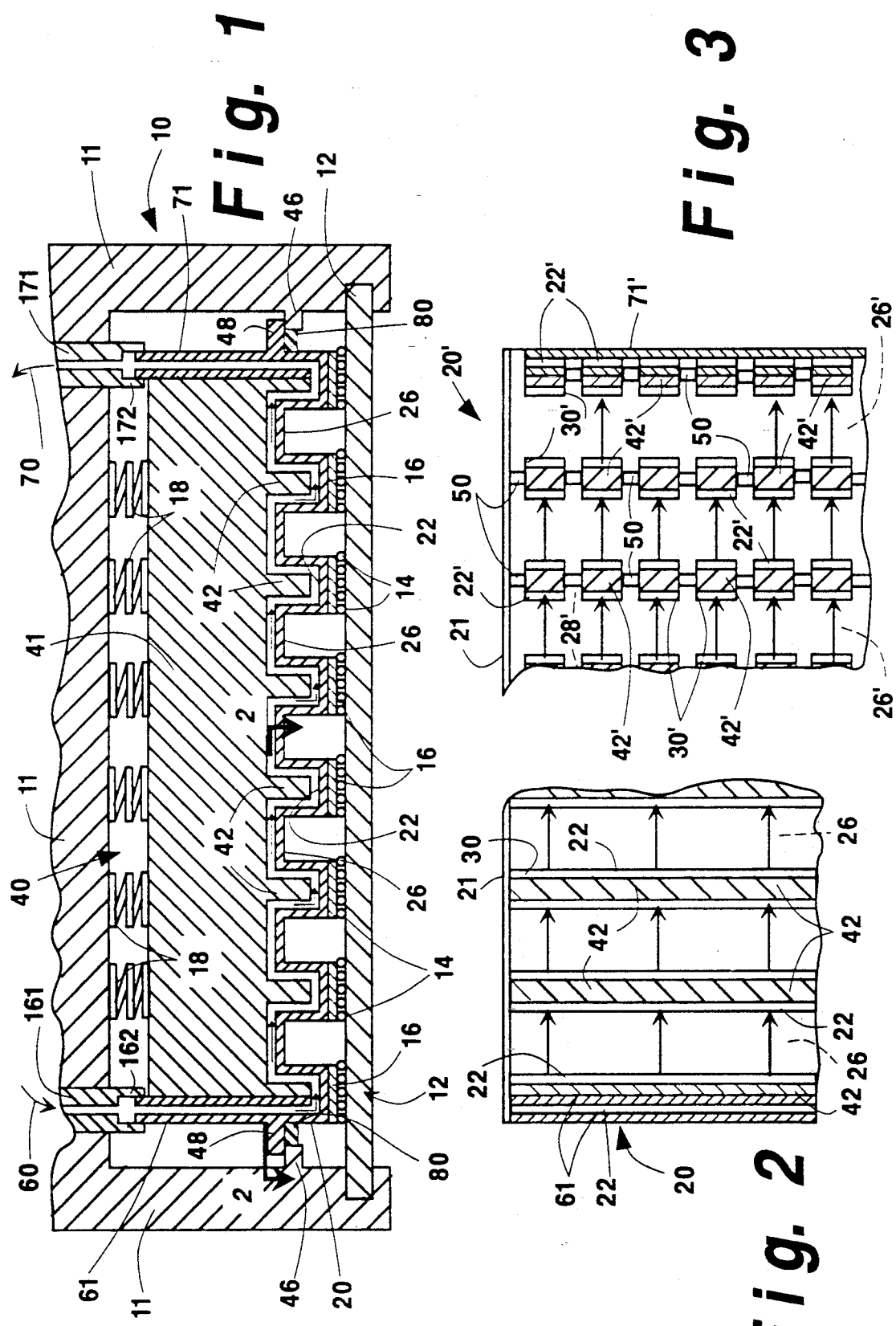

THERMAL CONDUCTION MODULE WITH INTEGRAL IMPINGEMENT COOLING

BACKGROUND OF THE INVENTION

This invention relates to an apparatus for cooling integrated circuit chips and, in particular, to a thermal conduction module with integral impingement cooling.

Integrated circuit chips mounted in an array on substrates present special cooling difficulties. Although chip size has increased and power usage is more efficient than in the past, the practice of mounting multiple, closely spaced chips in modules has required that more emphasis be placed on cooling systems to remove the relatively high density power dissipated by the chips. Liquid coolants are commonly employed in such high density applications.

Various systems have been disclosed in the art for providing a separate cooling member. Some of these utilize bellows-type liquid cool structures as exemplified by U.S. Pat. No. 4,977,443. However, such types of systems suffer in that they generally do not provide the large surface area required for high heat transfer rates. Other systems have attempted to utilize fins, channels or other structures in order to increase heat transfer area. U.S. Pat. No. 3,524,497 is one example which utilizes studs mounted in a liquid cooled structure for semiconductors. Another system, which utilizes microchannels, is exemplified by U.S. Pat. No. 4,758,926. A recent system disclosed in U.S. Pat. No. 4,964,458 to Flint et al., assigned to the assignee of the instant invention, uses a flexible layer having a thermally conductive fin assembly extending normally from the layer. The coolant flow in this fin type cooling system, as in other fin type systems, is in the same direction as the fins.

Japanese patent publication No. 57-96557 discloses another system which utilizes a series of baffle plates in an attempt to improve the efficiency of cooling by lengthening the flowing distance of the cooling medium. While this approach has some merit, the design is quite complex and expensive t fabricate. Other problems with prior art systems have been high pressure drop in the cooling medium utilized, and lack of uniformity of heat removal.

Bearing in mind the problems and deficiencies in the prior art, it is therefore an object of the present invention to provide a high performance cooling apparatus for integrated circuit chips mounted on a substrate.

It is another object of the present invention to provide an integrated chip cooling apparatus which provides uniformly high rates of heat removal.

It is a further object of the present invention to provide an efficient cooling apparatus for integrated circuit chips in which the coolant does not undergo high pressure drop.

It is yet another object of the present invention to provide a cooling apparatus which is in the form of a piston which may be placed over an integrated circuit chip module.

It is a further object of the present invention to provide a cooling apparatus which meets the above objects and which is relatively inexpensive and easy to manufacture.

SUMMARY OF THE INVENTION

The above and other objects, which will be apparent to those skilled in the art, are achieved in the present invention which comprises an apparatus for cooling at least one integrated circuit chip, and is preferably disposed over an array of integrated circuit chips mounted on a substrate. The apparatus includes a moveable piston for cooling the chips, the piston having a base, urged against an upper surface of the chips, of thermally conductive material. The base has on the lower surface thereof parallel channels between adjacent rows of the chips, and, on the upper surface thereof, parallel channels directly over the chips. The piston includes members extending downward into the upper surface channels for directing a flow of coolant into the upper surface channels and impinging the coolant on the channel bottoms. The flow directing members may be alternatively plate-like baffles or nozzles. The piston also includes passages for directing coolant from one upper surface channel to an adjacent upper surface channel in a flow direction perpendicular to the axes of the upper surface channels. An inlet and outlet are provided on the piston to connect to a source of the coolant. Couplings may be provided to permit movement between the piston and stationary pipes connected to the coolant source.

Preferably, the channels are parallel and extend across the width of the piston. In an alternate embodiment, the piston base additionally has lower surface channels between adjacent chips in each row of the chips, the additional lower surface channels being perpendicular to the first set of channels. Springs or inert gas urge the piston against the chips. Stops on the piston and/or housing restrict downward movement of the piston against the chips. A thermally conductive interface material may be employed between the piston base and the chips to aid heat transfer.

In a first embodiment, the piston end in thermal contact with the chips is formed from a layer of thermally conductive material having alternate open bottom and open top channels extending across the layer. The open bottom channels are between adjacent rows of the chips and the open top channels are directly over the chips. The piston includes passages for directing coolant between adjacent open top channels and internal members for directing coolant into the open top channels. In a second embodiment, the piston end in thermal contact with the chips is formed from a layer of thermally conductive material having rows of spaced, open top, cup-shaped depressions extending across the layer, each depression corresponding to and disposed over one of the chips. The piston includes passages for directing coolant between adjacent rows of the cup-shaped depressions and internal members for directing coolant into the depressions. Where the flow directing members are baffles, the piston passages may further include seals for restricting coolant flow in the spaces in each row between the cup-shaped depressions.

BRIEF DESCRIPTION OF THE DRAWINGS

FIG. 1 is a side elevational view, partially in section, of the lower portion of a preferred embodiment of the thermal conduction module of the present invention showing the integrated circuit chips and the piston cooling structure.

FIG. 2 is a sectional view of part of the lower portion of the piston as seen along line 2—2 of FIG. 1.

FIG. 3 is a sectional view of part of an alternative embodiment of the lower portion of the piston depicted in FIG. 1.

DETAILED DESCRIPTION OF THE INVENTION

Figure 4:
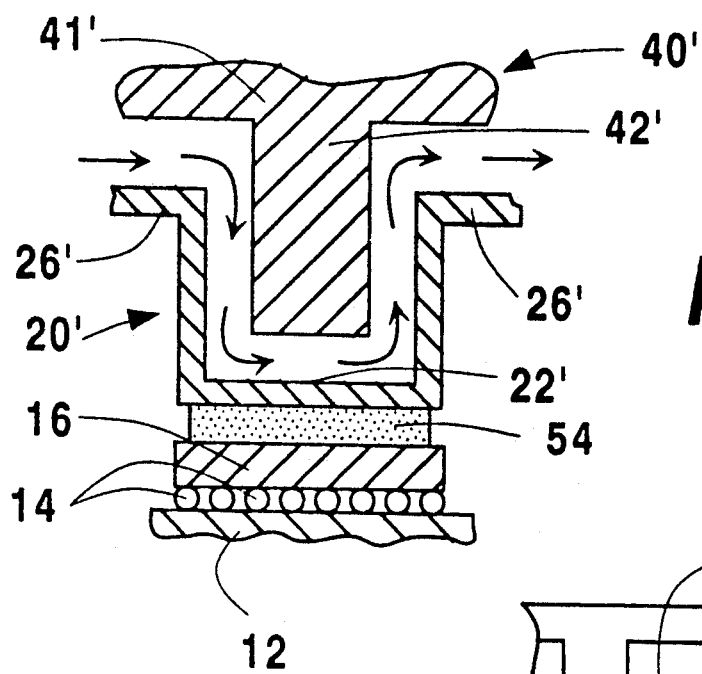
FIG. 4 is a side elevational view, partially in section, of a flow directing plate member and piston base in the alternative embodiment depicted in FIG. 3.

Preferred embodiments of the present invention are depicted in FIGS. 1-9D in which like numerals refer to like features of the invention. Such features are not necessarily shown to scale in the drawings.

The apparatus of the present invention provides a high performance cooling apparatus for use in a thermal conduction module (TCM) containing multiple integrated circuit chips. A typical module is depicted in side view in FIG. 1 as having a plurality of integrated circuit chips 16 mounted in an array, such as a 10×10 array, above a single or multiple layer substrate 12. The chips 16 are electrically connected to the substrate by a plurality of connections 14 such as solder balls, in a method known as "flip chip" packaging. The lower surface of substrate 12 may contain connectors (not shown) for connection of the module to a circuit board.

The chip-carrying substrate 12 is disposed within the housing 11 for the preferred thermal conduction module 10 of the present invention. As shown in FIG. 1, housing 11 has a lower cavity in which a cooling piston 40 is urged by springs 18 downward into thermal contact with the chips. The top surface of each chip 16 is contacted by the lower surface of piston base 20 which, in its preferred embodiment, is made of a formed layer of material of high thermal conductivity, such as copper, aluminum-clad copper, or other metal alloy. In the embodiment depicted in FIG. 1, base 20 has integrally formed therein straight, parallel channels 26 opening to and extending across the entire lower surface. Lower channels 26 are aligned so as to provide an open space between adjacent rows of chips 16. Disposed directly above the rows of chips 16 (and between lower surface channels 26) are channels 22 which open to and extend across the entire upper surface of base 20. The upper and lower surfaces of base 20 are shown in more detail in plan views in FIGS. 2 and 5 respectively.

In place of the springs 18, a pressurized inert gas may be utilized to urge the piston 40 downward against the chip carrying substrate 12. To prevent over pressure of the piston against the chips 16 mounted on substrate 12, complementary stops 46, 48 on housing 11 and piston 40, respectively, are provided to limit the downward displacement of piston 40 by springs 18 or other biasing media.

Passages are provided within piston 40 for flow of a liquid coolant such as water to provide cooling for the piston base and for chips 16. Coolant inlet 60 is provided in thermal conduction module housing 11 with an overlapping coupling structure or sleeve 162 at its lower end around piston coolant inlet 61 to provide a sliding seal as piston 40 is positioned up or down. Alternatively, a bellows structure may be provided to moveably connect stationary inlet pipe 161 to piston inlet 61. Piston inlet 61 expands in cross section area as it reaches its lower end so that coolant flows substantially to the entire length of the first upper surface channel 22 in base 20. Flow directing members 42 extend integrally below piston upper portion 41 and into spaced channels 22 to provide plate-like baffles which extend along the full length of each of the channels. Base 20 is spaced within its periphery from the lower side of piston upper portion 41 and members 42 to permit coolant to pass there between from on channel 22 to an adjacent channel 22, until the coolant flow reaches the far end of the piston base (on the right as shown in FIG. 1). Thereupon the coolant passes through a converging piston outlet 71 which is similarly slidably sealed within the lower portion of coolant outlet 70 to permit coolant to flow out of module 10. The piston outlet 71, is slidably connected to the stationary pipe 171, through the stationary pipe sleeve or bellows 172.

During the passage of coolant through piston 40, the general flow is in a direction normal to the longitudinal axes of channels 22. Flow directing members 42 urge the coolant in a direction downward so as to impinge against the inner surface of channels 22 and, in this manner, heat which is removed from chips 16 by conduction through base 20 is transferred to the coolant passing within the channels. Relatively high local heat transfer rates are achieved between the coolant in channel 22 and base 20 as a result of the impinging flow which reduces the thickness of the coolant boundary layer. Piston upper portion 41 and flow directing members 42 do not directly participate in the heat transfer other than to contain and direct the coolant flow. Accordingly, these portions of piston 40 need not be made from high thermally conductive material, but instead may be made of low thermal conductivity, non-electrically conductive material such as plastic.

Piston upper portion 41 may be secured and hermetically sealed to piston base 20. This can be done in a variety of ways, for example, by brazing (if metal) or by use of an adhesive (if plastic) or by a mechanical type connection using an 0-ring type seal.

Figure 5:
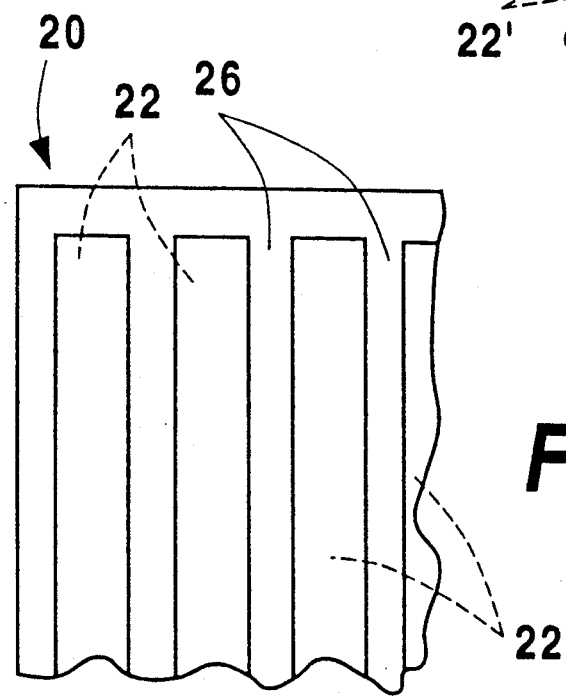
FIG. 5 is a bottom view of the lower portion of the piston shown in FIG. 2.

As can be seen in FIG. 2, ends 30 of channels 22 are adjacent to base periphery 21 and prevent the coolant from bypassing flow through the channels. Also, as best seen in FIG. 5 in a partial plan view of the lower surface of base 20, channels 26 are parallel and alternate between upper surface channels 22. These lower surface channels 26 permit passage of oil, gas or other fluid type cooling media to the region between piston base 20 and substrate 12. A ring seal 80 may be provided between base periphery 21 and housing 11 at stops 46 and 48 to encase and isolate the region directly around the chips and prevent leakage.

Figure 6:
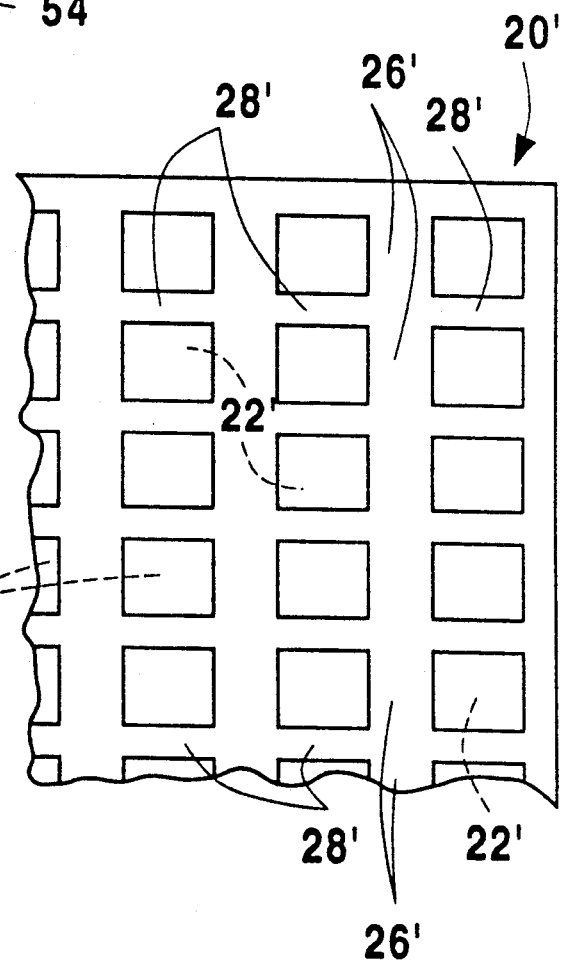
FIG. 6 is a bottom view of the lower portion of the piston shown in FIG. 3.

An alternate embodiment of the present invention is depicted in FIGS. 3, 4 and 6 in which a second set of channels 28' are provided on the lower surface of piston base 20'. These additional channels 28' are perpendicular to channels 26' on the base lower surface (FIG. 6). Instead of continuous channels being formed on the upper surface of base 20' as in the previous embodiment, there are now formed interrupted, cup-shaped channel segments or depressions 22' opening to the top of the piston base 20' (FIG. 3). The cup-shaped depressions 22' are arrayed in spaced rows defined by lower channels 26', and, in each row, the depressions are spaced from each other by lower channels 28'. Each cup-shaped depression 22' is normally located directly above a particular site of a chip 16 on the substrate 12. In this embodiment, interrupted flow directing members 42' are provided for each cup-shaped depression 22' to direct the flow of coolant against the bottom surface of the depression. As shown in more detail in a side view in FIG. 4, the coolant flows downward between the upper portion 41' of piston 40' and the base 20', and is directed downward in each depression 22' so as to impinge upon the base directly above each chip 16. Seals 50 between the piston upper portion 41' and base 20' are provided between the end walls 30' of adjacent depressions 22' in each row to prevent coolant from bypassing flow through the depressions. The coolant exits through converging piston outlet 71' (FIG. 3). Also shown in FIG. 4 is the use of an inert, thermally conductive interface material 54, such as solder or a thermally conductive grease, to provide improved thermal contact between base 20' and chip 16 in case of slight chip tilt or other misalignment.

As in the first embodiment, the coolant flow in the alternative embodiment depicted in FIGS. 3, 4 and 6 is normal to the axis of lower surface channel 26', as indicated by the arrows in FIGS. 3 and 4. The cup-shaped depression 22' over the chip sites provide more direct and concentrated cooling to the chips. The additional cross channels 28' open to the lower surface of base 20' also permit additional passage of coolant directly over the chip 16 and the substrate 12.

With either embodiment, the lower surface of the piston base which contacts the top surface of the integrated circuit chips may be either straight or slightly convex in shape. The lower surface of the piston base 20, 20' may be also anodized for electrical isolation. The corrugated shape provided by the upper and lower surface channels in the piston base 20, 20' aid in making the entire base somewhat compliant so as to better conform to the chips 16 on the substrate 12.

Figure 7:
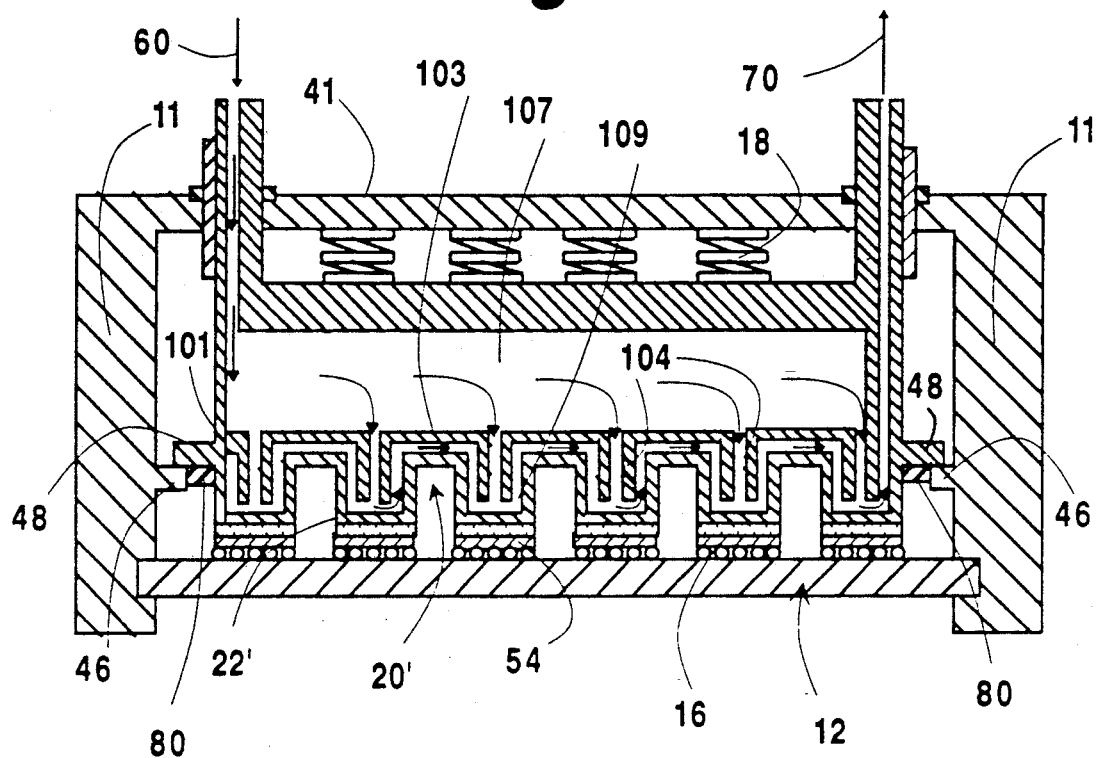
FIG. 7 is a side elevational view, partially in section, of the lower portion of another preferred embodiment of the thermal conduction module of the present invention showing the integrated circuit chips and the piston cooling structure.
Figure 8:
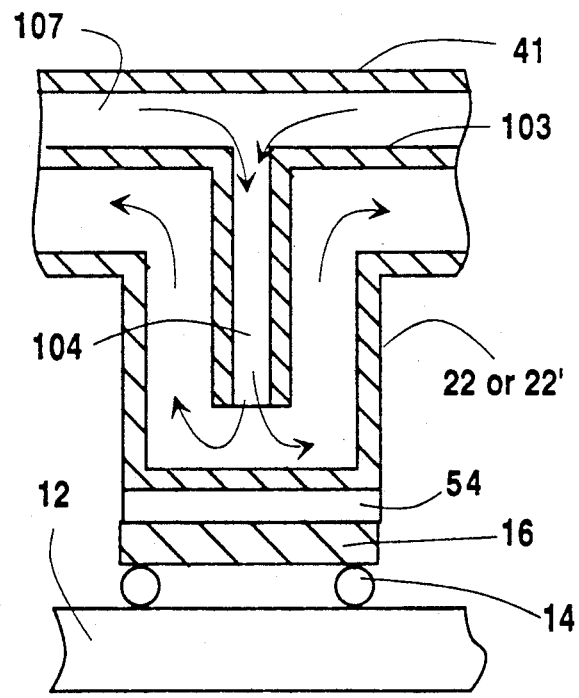
FIG. 8 is a side elevational view, partially in section, of a flow directing nozzle member and piston base in the embodiment depicted in FIG. 7.

In place of the plate-like baffles depicted in FIGS. 1-6, flow directing nozzles may be provided to direct the flow of coolant into the channels or cup-shaped depressions in the piston base embodiments described previously. Such flow directing nozzles 104 are depicted in FIGS. 7-9D. As seen in FIG. 7, a plurality of tubular, preferably cylindrical, nozzles 104 extend into cup-shaped depressions 22' of piston base 20', the lower surfaces of which depressions 22' contact chip 16. Nozzles 104 extend downward from a reservoir 107 for the coolant which is formed by a manifold 103 secured by seal 101 within piston upper member 41. As the coolant enters the reservoir through inlet 60, it is distributed by manifold 103 to the various nozzles 104 whereby the coolant impinges against the inner surface of cup-shaped depressions 22' to provide cooling to chips 16. Spent coolant flows upward and outward around the nozzle 104 from each depression 22' (FIG. 8). Preferably, no obstructions such as seals 50 (see FIG. 3) are provided which would interfere with the flow of coolant in the space 109 between manifold 103 and the upper surface of piston base 20'. The flow of spent coolant is generally to the right as shown in FIG. 7 so that the coolant exits the piston through outlet 70.

Instead of the piston base 20' which has cup-shaped depressions 22', the flow directing nozzles may be utilized with the piston base embodiment which has channels 22 extending across the width of the base (FIGS. 1, 2 and 5). In this embodiment, a series of spaced nozzles 104 are provided in a row in each of channels 22 to direct the coolant into the full width of piston base 20. The nozzles are preferably located above the chip sites for maximum cooling. Spent coolant flows outward from each channel between the nozzles to the outlet.

Figure 9A:
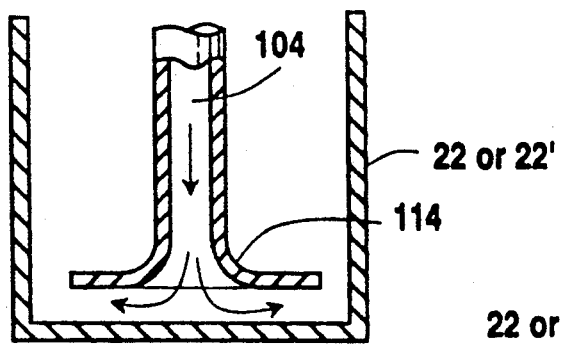
FIGS. 9A, 9B, 9C, and 9D are side elevational views, partially in section, of alternate configurations of the nozzle member depicted in FIG. 8.
Figure 9B:
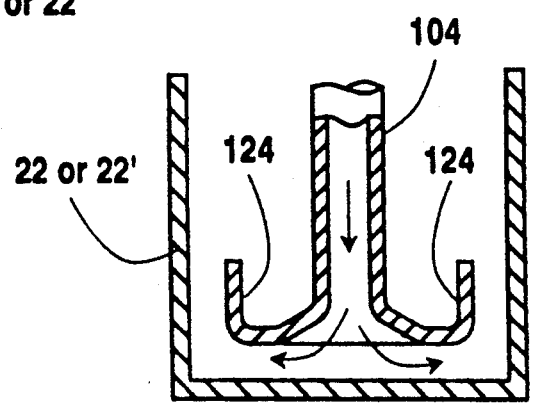
Figure 9C:
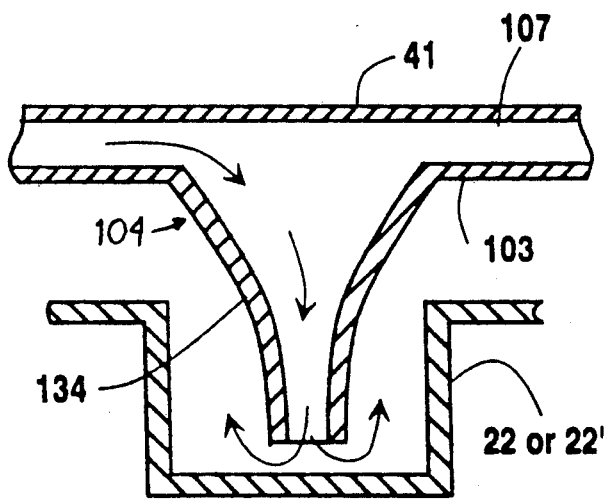
Figure 9D:
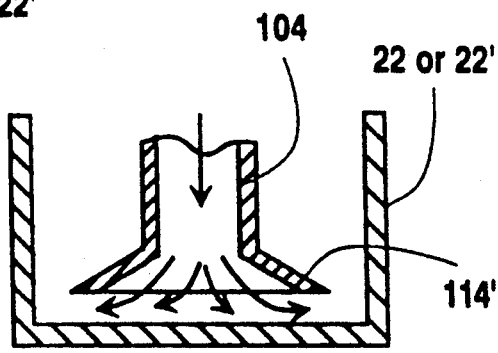

Various flow-enhancing configurations for nozzles 104 are depicted in FIGS. 9A, 9B, 9C and 9D. In FIG. 9A, the lower end 114 of nozzle 104 diverges in a horn shape to direct the coolant in an impinging flow against, and then radially outward along, the bottom of channel 22 or depression 22'. The configuration shown in FIG. 9B has a diverging horn shape which also contains upward flanges 124 to ensure good contact of coolant with the bottom and walls of channel 22 or depression 22'. A nozzle 104 having a converging configuration 134 is shown in FIG. 9C for directing increased impinging flow against the channel 22 or depression 22' bottom. The nozzle 104 depicted in FIG. 9D has a conical, diverging lower end 114' which minimizes the gap at the points away from the jet impingement area, thereby increasing the heat transfer coefficient (increasing velocity with decreased cross sectional area) and the rate of heat transfer.

The present invention provides for a general flow of coolant across the base of the piston in a direction generally normal to the orientation of the rows of channels. The coolant is directed downward at the upper surface of the piston base above the chip sites to increase the rate of heat transfer to the coolant. The coolant-carrying passages in both embodiments of the piston are relatively non-constrictive to coolant flow and therefore do not cause an excessive pressure drop of the coolant through the entire assembly. The particular configuration of the baffles and/or channels may be varied across the piston base to accommodate different heat loads generated on particular areas of the chip-carrying substrate.

Thus, the present invention provides a single piston thermal conduction module which integrally incorporates impingement cooling of the base above each chip site. With the exception of the piston base, virtually the entire structure of the thermal conduction module of the present invention can be made from low or non-conductive materials such as plastic. The base should naturally be made of high thermal conductivity material. Thus, relatively inexpensive manufacturing techniques may be utilized in constructing and assembling the thermal conduction module, for example, stamped sheet metal for the piston base and injection molded plastic for the remaining components. The particular configuration as described herein provides uniformly high rates of heat removal from the integrated circuit chips without causing the liquid coolant to undergo a high pressure drop, thereby meeting the objects set forth above.

While this invention has been described with reference to specific embodiments, it will be recognized by those skilled in the art that variations are possible without departing from the spirit and scope of the invention, and that it is intended to cover all changes and modifications of the invention disclosed herein for the purposes of illustration which do not constitute departure from the spirit and scope of the invention.

Having thus described the invention, what is claimed is:

1. A thermal conduction module comprising:

a substrate having a chip-carrying surface;
at least one integrated circuit chip on said substrate; and
a piston for cooling said at least one chip, said piston having a base, urged in thermal contact with an upper surface of said at least one chip, of thermally conductive material, said base having at least one channel above said at least one chip, and including at least one baffle extending downward into said at least one channel for directing a flow of coolant into said at least one channel and impinging coolant on the channel bottom, said piston further including passages for directing coolant from said at least one channel in a flow direction perpendicular to the axis of said at least one channel, said piston further having an inlet and outlet for a coolant.

2. The thermal conduction module of claim 1 wherein said module comprises a plurality of said channels and wherein said channels are parallel and extend across the width of said piston.

3. The thermal conduction module of claim 1 wherein said baffle comprises a plate extending downward into said at least one channel.

4. The thermal conduction module of claim 1 further including biasing means selected from the group consisting of springs and pressurized gas for urging a portion of said piston against said at least one chip.

5. The thermal conduction module of claim 4 further including couplings for the coolant inlet and outlet adapted to permit movement between the piston and stationary pipes connected to a source of a coolant.

6. The thermal conduction module of claim 4 further including stops for restricting downward movement of said piston by said biasing means against said at least one chip.

7. The thermal conduction module of claim 1 further including a thermally conductive interface material between said piston base and said at least one chip.

8. The thermal conduction module of claim 1 wherein said base is made from metal having said at least one channel integrally formed therein.

9. A thermal conduction module comprising a substrate having a chip-carrying surface; a plurality of integrated circuit chips arrayed in rows on said substrate; a piston for cooling said chips, said piston having an end in thermal contact with said chips, said piston end being formed from a layer of thermally conductive material having alternate open bottom and open top channels extending across said layer, said open bottom channels being between adjacent rows of said chips and said open top channels being directly over said chips, said piston including passages for directing coolant between adjacent open top channels and internal members for directing coolant into said open top channels; and an inlet and outlet on said piston for a coolant.

10. The thermal conduction module of claim 9 wherein said internal members comprise baffles extending downward into said channels.

11. The thermal conduction module of claim 9 wherein said internal members comprise nozzles extending downward into said channels.

12. The thermal conduction module of claim 9 further including means selected from the group consisting of springs and pressurized gas for urging said piston against said chips.

13. The thermal conduction module of claim 9 further including couplings for the coolant inlet and outlet adapted to permit movement between the piston and stationary pipes connected to a source of a coolant.

14. The thermal conduction module of claim 9 further including stops for restricting downward movement of said piston against said chips.

15. The thermal conduction module of claim 9 further including a thermally conductive interface material between said piston end and said chips.

16. A thermal conduction module comprising a substrate having a chip-carrying surface; a plurality of integrated circuit chips arrayed in rows on said substrate; a piston for cooling said chips, said piston having an end in thermal contact with said chips, said piston end being formed from a layer of thermally conductive material having rows of spaced, open top, cup-shaped depressions extending across said layer, each depression corresponding to and disposed over one of said chips, said depressions being spaced from one another by open bottom channels formed in said layer between adjacent rows of said chips, said piston including passages for directing coolant between adjacent rows of said cup-shaped depressions and internal members for directing coolant into said depressions; and an inlet and outlet on said piston for a coolant.

17. The thermal conduction module of claim 16 wherein said internal members comprise baffles extending downward into said cup-shaped depressions.

18. The thermal conduction module of claim 16 wherein said internal members comprise nozzles extending downward into said cup-shaped depressions.

19. The thermal conduction module of claim 16 wherein said piston passages further include seals for restricting coolant flow in the spaces in each row between said cup-shaped depressions.

20. The thermal conduction module of claim 16 further including means selected from the group consisting of springs and pressurized gas for urging said piston against said chips.

21. The thermal conduction module of claim 16 further including couplings for the coolant inlet and outlet adapted to permit movement between the piston and stationary pipes connected to a source of a coolant.

22. The thermal conduction module of claim 16 further including stops for restricting downward movement of said piston against said chips.

23. The thermal conduction module of claim 16 further including a thermally conductive interface material between said piston end and said chips.

24. A thermal conduction module comprising:
a substrate having a chip-carrying surface;
at least one integrated circuit chip on said substrate; and
a piston for cooling said at least one chip, said piston having a base, urged against an upper surface of said at least one chip, of thermally conductive material, said base having at least one channel above said at least one chip, and including at least one nozzle extending downward into said at least one channel for directing a flow of coolant into said at least one channel and impinging coolant on the channel bottom, said nozzle having a lower end configuration selected from the group consisting of converging and diverging ends, said piston further including passages for directing coolant from said at least one channel in a flow direction perpendicular to the axis of said at least one channel, said piston further having an inlet and outlet for a coolant.

25. The thermal conduction module of claim 24 wherein said nozzle has a converging lower end.

26. The thermal conduction module of claim 24 wherein said nozzle has a diverging lower end.

27. The thermal conduction module of claim 24 wherein said nozzle has a diverging conical lower end.

28. The thermal conduction module of claim 24 wherein said nozzle has a diverging horn-shaped lower end.

29. The thermal conduction module of claim 24 wherein said nozzle has a diverging horn-shaped lower end further having upward flanges for ensuring good coolant contact with said at least one channel.

* * * * *